US008483408B2

(12) United States Patent
Kang

(10) Patent No.: US 8,483,408 B2
(45) Date of Patent: Jul. 9, 2013

(54) MOBILE COMMUNICATION DEVICE CAPABLE OF SETTING TONE COLOR AND METHOD OF SETTING TONE COLOR

(75) Inventor: Tae-Jin Kang, Seoul (KR)

(73) Assignee: Samsung Electronics Co,. Ltd., Suwon-si (KR)

( * ) Notice: Subject to any disclaimer, the term of this patent is extended or adjusted under 35 U.S.C. 154(b) by 725 days.

(21) Appl. No.: 12/283,774

(22) Filed: Sep. 16, 2008

(65) Prior Publication Data
US 2009/0074207 A1 Mar. 19, 2009

(30) Foreign Application Priority Data

Sep. 17, 2007 (KR) ........................ 10-2007-0094223

(51) Int. Cl.
*H03G 5/00* (2006.01)
(52) U.S. Cl.
USPC ........ 381/103; 381/102; 381/104; 455/432.1; 455/556.1; 379/387.01

(58) Field of Classification Search
USPC ............ 381/102, 103, 104; 455/432.1, 556.1; 379/387.1
See application file for complete search history.

(56) References Cited

U.S. PATENT DOCUMENTS

| 2002/0086653 | A1* | 7/2002 | Kim | .............................. 455/307 |
| 2003/0100334 | A1* | 5/2003 | Mazzara, Jr. | .................. 455/552 |
| 2009/0047993 | A1* | 2/2009 | Vasa | .......................... 455/556.1 |

FOREIGN PATENT DOCUMENTS
KR 1020060065270 A 12/2004

* cited by examiner

*Primary Examiner* — Thanh V Pham

(57) ABSTRACT

A mobile communication device and a method of setting tone color, which allow a user to set the tone color of received sound. Provided are a normal mode, which sets the equalizer using GCF standards stored in an internal memory or equalizer setting values selected by a provider, a country-specific mode, which uses country-specific setting, and a user mode, in which a user can set frequency-specific gains of the received sound, and one mode is selected from the provided mode, so that the tone color of the received sound can be adjusted according to the selection. Telephone speech quality can be optimized for user preference, network environments and language characteristics.

20 Claims, 4 Drawing Sheets

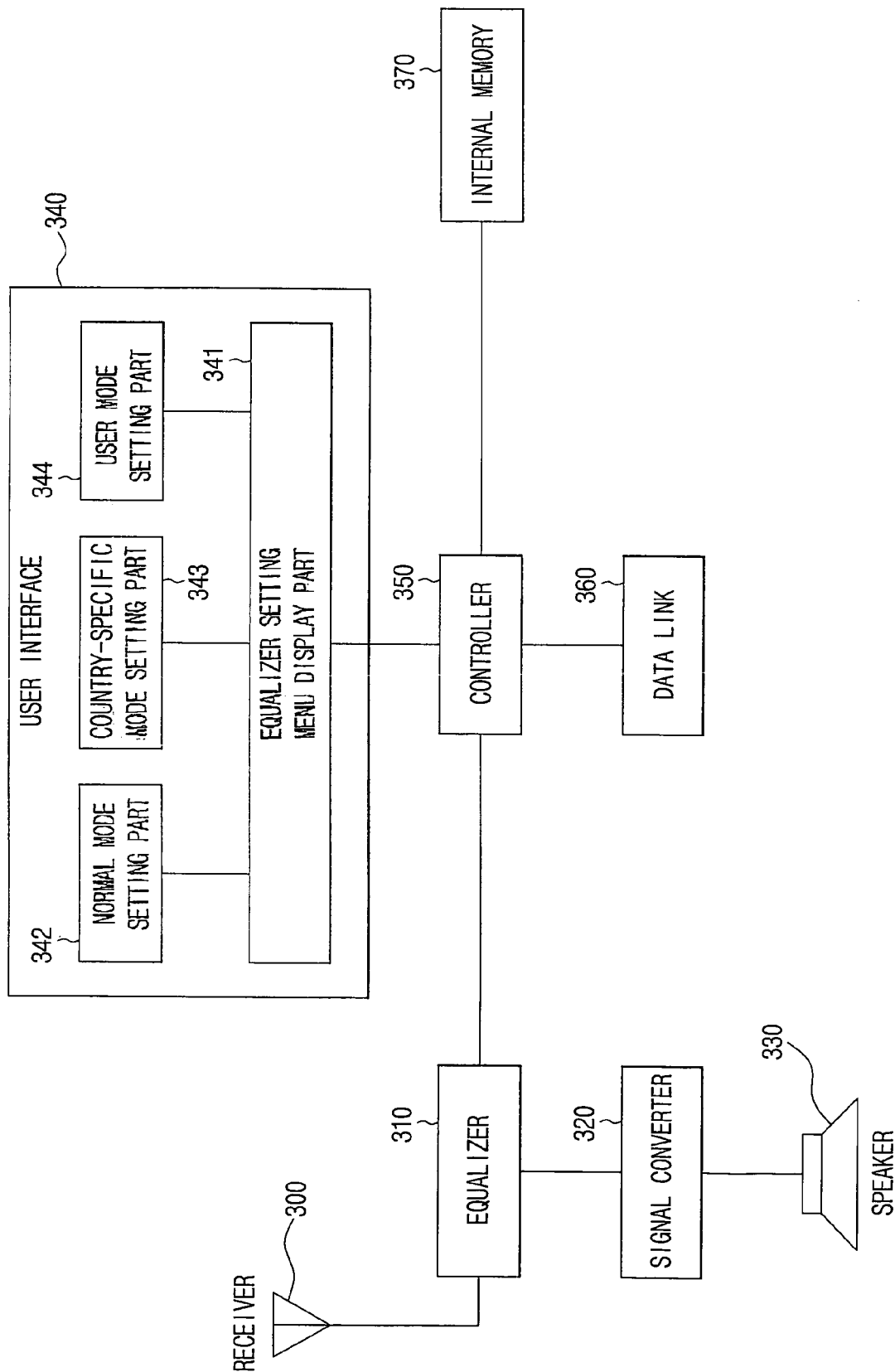

FIG. 4A

| 410 | 411 | 412 | 413 | 414 | |
|---|---|---|---|---|---|
| FREQUENCY NUMBER | 1st FREQUENCY | 1st GAIN | 2nd FREQUENCY | 2nd GAIN | ...... |

FIG. 4B

| 430 | 431 | 432 | 433 | 434 | |
|---|---|---|---|---|---|
| COUNTRY NUMBER | NAME OF 1st COUNTRY | EQUALIZER SETTING OF 1st COUNTRY | NAME OF 2nd COUNTRY | EQUALIZER SETTING OF 2nd COUNTRY | ...... |

FIG. 4C

| 400 | 420 | 440 |
|---|---|---|
| CURRENT EQUALIZER SETTING | USER-SELECTED EQUALIZER SETTING | COUNTRY-SPECIFIC EQUALIZER SETTING |

MOBILE COMMUNICATION DEVICE CAPABLE OF SETTING TONE COLOR AND METHOD OF SETTING TONE COLOR

CROSS-REFERENCE TO RELATED APPLICATION(S) AND CLAIM OF PRIORITY

The present application makes reference to and claims all benefits accruing under 35 U.S.C. §119 from an application for "MOBILE COMMUNICATION DEVICE CAPABLE OF SETTING TONE COLOR AND METHOD OF SETTING TONE COLOR" earlier filed in the Korean Intellectual Property Office on Sep. 17, 2007, and there duly assigned Serial No. 2007-0094223.

TECHNICAL FIELD OF THE INVENTION

The present invention relates to a mobile communication device having an equalizer and a method of setting tone color, and more particularly, to a mobile communication device and a method of setting tone color, by which a user can adjust the tone color of received sound, and in the case of automatic roaming, optimize the tone color for individual countries.

BACKGROUND OF THE INVENTION

An equalizer is a device that alters tone color by adjusting the gain of a musical range and is used to change the atmosphere of music or compensate for sound quality. For example, the equalizer increases the gain of low frequency in order to boost low tone, and increases the gain of middle frequency in order to boost human voice. When high tone is unpleasant to the ear, the gain of high frequency is decreased.

The equalizer can also be used in a mobile communication device, generally, in order to compensate for telephone speech quality. A number of mobile communication devices adjust the tone color of received sound using an equalizer function. More specifically, the mobile communication devices are delivered in a state that the tone color of received sound is uniformly set by providers or according to the GCF standard, so that telephone speech quality can be optimized for network status.

While this approach can improve telephone speech quality, there is no user interface that allows the user to newly set the gain of received sound according to frequency using the equalizer. The problem is that it is impossible to enable the proper function of the equalizer for adjusting tone color in that the user cannot change the tone color of received sound even if he/she dislikes it.

In the case of automatic roaming service that extends the connectivity of a mobile communication device in a foreign network that is different from the domestic network where the mobile communication device was registered, the equalizer cannot optimize the tone color of received sound in the foreign network since the setting of the tone color is fixed to domestic network environments.

For example, Chinese prefer to high tone and large sound, Europeans prefer to powerful middle-low tone and clear tone color, and Americans prefer to powerful middle-low tone and smooth tone color. Therefore, in the case of using the roaming service in a foreign country, it is necessary to modify the tone color of received sound according to the network and language characteristics of the corresponding country. However, a mobile communication device of the prior art does not support such a function.

SUMMARY OF THE INVENTION

To address the above-discussed deficiencies of the prior art, it is a primary object to provide a mobile communication device and a method of setting tone color, which allow a user to set the tone color of received sound according to his/her preference by adjusting an internal equalizer and also to optimize the tone color for a foreign network and language environments in the case of automatic roaming.

According to an aspect of the present invention, the mobile communication device includes a user interface including an equalizer setting menu module, which displays an equalizer setting menu and enables a module corresponding to a selected equalizer setting mode, and a user mode module, which, when a user mode is selected from the equalizer setting menu, sets an equalizer in response to a user adjusting a frequency-specific gain of received sound; an internal memory, which stores equalizer setting data; an equalizer adjusting the tone color of the received sound; and a controller control the equalizer according to the equalizer setting that is inputted through the user interface.

The equalizer setting data may have a data structure, which includes currently-used equalizer setting, user-selected equalizer setting and country-specific equalizer setting (i.e., equalizer setting according to each country).

The user interface may further include a country-specific mode module, which reads in the country-specific equalizer setting of the equalizer setting data from the internal memory when a country-specific mode (i.e., a mode according each country) is selected from the equalizer setting menu, displays respective country names, and applies the equalizer setting of a selected country.

The country-specific module may update the country-specific equalizer setting in the internal memory when a new country is added, country information is deleted from the memory, a country name is edited, or the equalizer setting is edited in a corresponding country.

The country-specific module may provide an option of roaming service synchronization, and when the option of roaming service synchronization is selected, the country-specific module applies equalizer setting optimized for a roaming service area to the equalizer.

The roaming service area may be identified by a communication system, such as CDMA, GSM or JCDMA, which is used in the roaming service area, and be automatically set in response to the activation of automatic roaming service, or via the interface of a mobile communication device.

The user interface may further include a normal mode, which sets the equalizer using GCF standards stored in the internal memory or equalizer setting values selected by a provider.

The mobile communication device may further include a data link connected to an external device, wherein the data link stores equalizer setting data inputted from the external device in the internal memory, and applies the currently-used equalizer setting included in the inputted equalizer setting data to the equalizer.

According to an aspect of the present invention, the method of setting tone color of received sound in a mobile communication device includes procedures of: providing an interface, which supports a user in adjusting an equalizer setting of a received sound; and adjusting, at an equalizer, the tone color of the received sound in response to an input through the user interface.

The procedure of providing an interface may include displaying an equalizer setting menu, which supports selecting one of a country-specific mode in which different equalizer settings are used according to countries, and a user mode, which enables a user to adjust the equalizer setting of the received sound; and determining the equalizer setting by selecting one mode from the equalizer setting menu.

The procedure of providing an interface may include providing an option of roaming service synchronization, and when the option is selected, enabling the equalizer setting to be optimized for a selected roaming service area.

According to an aspect of the present invention, the method of setting the tone color of a received sound in a mobile communication device includes procedures of: connecting to an external device and receiving equalizer setting therefrom; and adjusting, at an equalizer, the tone color of the received sound based on the equalizer setting.

The equalizer setting data received from the external device, may include a data structure, which includes currently-used equalizer setting, user-selected equalizer setting and country-specific equalizer setting.

The procedure of receiving equalizer setting may include storing the equalizer setting from the external device in an internal memory; and displaying a message that notifies the change in the equalizer setting.

As set forth above, the present invention can support the tone color of received sound according to the preference of the user, thereby making the user be more satisfied. In the case of automatic roaming, the tone color can be optimized for network environments and language characteristics of a visiting country. Furthermore, the present invention can also support an option of roaming service optimization so that equalizer setting can be automatically optimized for an automatic roaming service area.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 3 is a block diagram illustrating a mobile communication device of the present invention;

FIG. 4A is a diagram illustrating a data structure of frequency-specific gains, which is used to store the equalizer setting of a mobile communication device of the present invention;

FIG. 4B is a diagram illustrating a data structure of country-specific equalizer setting, which is used to store the equalizer setting of a mobile communication device of the present invention; and FIG. 4C is a diagram illustrating a data structure of equalizer setting data, which is used to store the equalizer setting of a mobile communication device of the present invention.

DETAILED DESCRIPTION OF THE INVENTION

FIGS. 1 through 4C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged mobile communication device.

Figure 1:
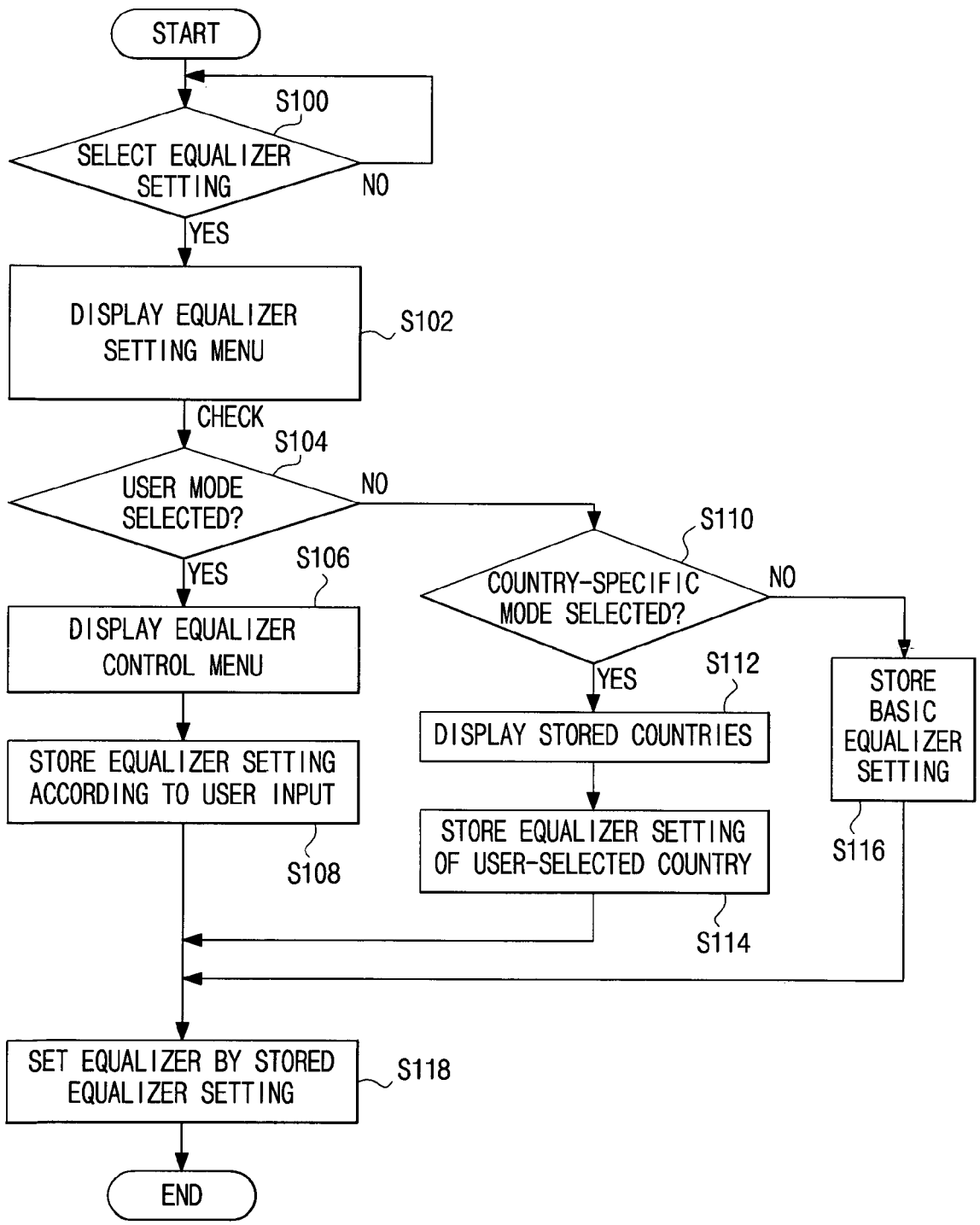
FIG. 1 is a flowchart illustrating a method of setting the tone color of received sound using a user interface of a mobile communication device.

FIG. 1 is a flowchart illustrating a method of setting the tone color of received sound by a user interface of a mobile communication device.

As shown in FIG. 1, when a user selects "equalizer setting" from a user interface (S100), an equalizer setting menu is displayed (S102).

The equalizer setting menu may include a normal mode, a county-specific mode (i.e., a mode according to each country) and a user mode.

If the user mode is selected (S104), an equalizer control interface is displayed (S106), so that a user can set desirable tone color by controlling each gain according to frequency.

For example, the user can increase the gain of low frequency when he/she wants to emphasize low sound, or increase the gain of middle frequency when he/she wants clear voice.

When the user completes inputting desired equalizer setting in response to the displaying step S106, the inputted equalizer setting is stored as currently-used equalizer setting in an internal memory (S108).

If the user selects the country-specific mode (S110), a list of countries stored in the internal memory is displayed (S112), so that the user can select one country from the displayed country list.

The country list may include country names included in country-specific equalizer setting of the equalizer setting data.

The country list displaying step S112 supports adding a new country, deleting stored information of a country, editing a stored country name, and editing the equalizer setting in a home or visiting country. Preferably, the country list displaying step S112 further includes a step of updating the country-specific equalizer setting of the equalizer setting data, stored in the internal memory.

The country list displaying step S112 may provide an option of automatic roaming service area synchronization.

When the user selects one country from the list, the frequency-specific gains (i.e., gains according to frequencies) of the selected country are stored as currently-used equalizer setting (S114).

When the option of automatic roaming service area synchronization is selected, the country selecting step S114 can store equalizer setting, optimized for a roaming service area, as currently-used equalizer setting.

The roaming service area is identified by the communication system (CDMA, GSM, JCDMA, and so on), which is used in the roaming service area. The roaming service area option can be automatically set in response to the activation of automatic roaming service, or be set via the interface of a mobile communication device.

Preferably, the equalizer setting of the roaming service area is previously stored at the time the mobile communication device is manufactured.

When the user selects the normal mode, the basic frequency-specific equalizer setting stored at the time of manufacturing is set as the currently-used equalizer setting in the internal memory (S116).

Through the user mode, the country-specific mode and a basic mode, a controller controls the equalizer using the currently-used equalizer setting, stored in the internal memory (S118). Later, the tone color of received sound is adjusted by the equalizer setting of the user.

Figure 2:
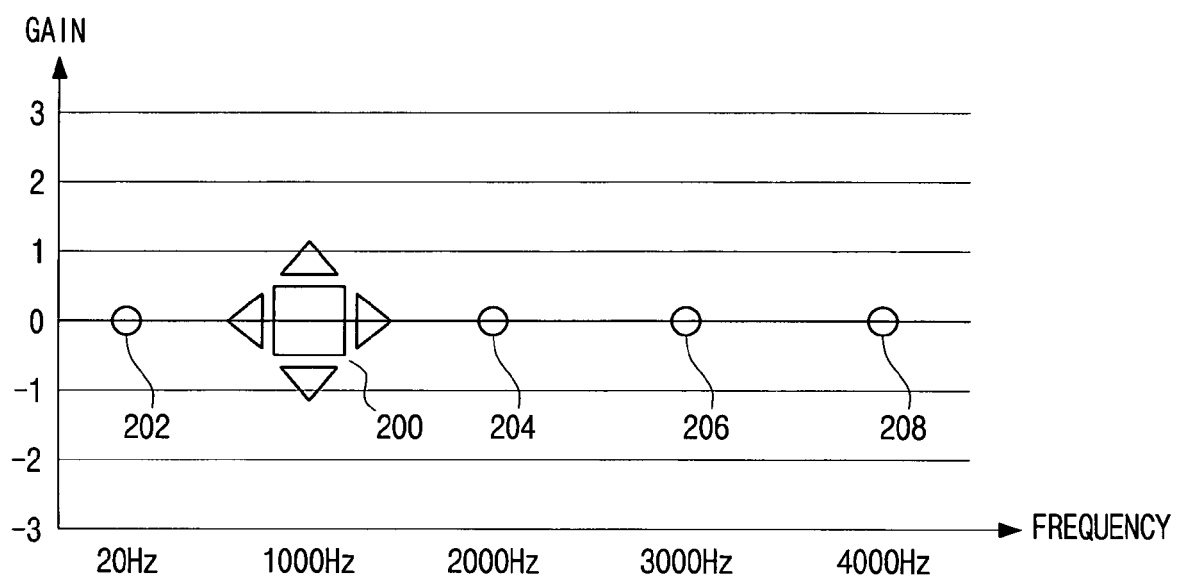
FIG. 2 is a graph illustrating an equalizer control interface, which appears when a user mode of an equalizer setting menu is selected.

FIG. 2 shows an embodiment of the equalizer control interface that appears when the user mode of the equalizer setting menu is selected (S104).

As shown in FIG. 2, gains at 20 Hz, 1000 Hz, 2000 Hz, 3000 Hz and 4000 Hz can be adjusted, and each gain can have a value in the range from −3 to +3. Each frequency can be replaced by a different value in response to the development of technology, and the selectable range of the gains can also be enlarged or reduced.

The user can recognize a currently selected frequency based on a cursor 200, increase or reduce the gain of the currently-selected frequency using an upward or downward arrow key in a keyboard, and select a frequency bandwidth, which he/she wants to adjust using a rightward or leftward arrow key in the keyboard.

Describing, as an example, the equalizer setting situation shown in FIG. 2, the currently-selected frequency is 1000 Hz, and the user can raise the level of middle-low sound, such as 1000 Hz, by selecting the upward arrow key or reduce the level of the same by selecting the downward arrow key. As shown, the gain 202 at a low sound 20 Hz is zero (0), which is not adjusted from the reference value. The gains 204, 206 and 208 at the other frequencies are in the same state.

During adjustment, it is possible to play part of stored sound as a test. In this case, it is preferable that the stored sound or sample voices are played through the equalizer setting adjusted by the user input at that moment.

When the setting is finished, frequency-specific gains, set through an enter key or the like in the key pad, are stored in the currently-used equalizer setting (S108).

FIG. 3 is a block diagram illustrating a mobile communication device of the present invention.

As shown in FIG. 3, the mobile communication device of the present invention includes a receiver 300, an equalizer 310, a signal converter 320, a speaker 330, a user interface 340, a controller 350, a data link 360 and an internal memory 370.

The receiver 300 receives a radio signal when a received call is connected, and sends the received radio signal to the equalizer 310.

The equalizer 310 controls the tone color of the radio signal from the receiver 300 according to an equalizer setting that is supplied through the user interface 340 by a frequency-specific gains stored in its own memory, and sends the tone-compensated radio signal to the signal converter 320.

The signal converter 320 converts the tone-controlled radio signal from the equalizer 310 into an audio signal that a speaker can reproduce, and sends the audio signal to the speaker 330.

The speaker 330 reproduces the audio signal received from the signal converter 320.

The user interface 340, under the control of the controller 350, displays an equalizer setting menu, a country-specific equalizer setting interface and a user equalizer setting interface, and in response to a user input, changes the setting of the equalizer 310 via the controller 350, and stores equalizer setting data in the internal memory 370.

It is preferable that the equalizer setting data be a data structure that includes currently-used equalizer setting, user-selected equalizer setting and country-specific equalizer setting.

As shown in FIG. 3, the user interface 340 includes an equalizer setting menu display part 341, a normal mode setting part 342, a country-specific mode setting part 343 and a user mode setting part 344. The equalizer setting menu display part 341 enables the operation of the equalizer setting menu. When a normal menu is selected from the equalizer setting menu, the normal mode menu 342 sets an initial equalizer setting value given at the time of manufacturing in the equalizer 310. When a country-specific menu is selected from the equalizer setting menu, the country-specific mode setting part 343 reads in the country-specific equalizer setting from the internal memory 370 and displays country names. When a user selects one of the country names, the country-specific mode setting part 343 applies the equalizer setting of the selected country to the equalizer 310. The user mode setting part 344 provides an interface for adjusting the gain of each frequency when the user mode is selected from the equalizer setting menu. When the user changes the equalizer setting, the user mode setting part 344 stores the changed equalizer setting in the equalizer setting data in the internal memory 370, and applies the changed equalizer setting to the equalizer 310.

The controller 350 is connected to the user interface 340, the equalizer 310, the internal memory 370 and the data link 360 to control the operation of respective parts and control the equalizer 310 according to relevant equalizer setting when is adjusted equalizer setting of tone color through the user interface 340.

The data link 360 is connected to an external device, and when the equalizer setting data is inputted from the external device, the data link 360 notifies the controller 350 of the input of the equalizer setting data. The data link 360 also transmits the equalizer setting data from the controller 350 to the external device.

The internal memory 370 stores the equalizer setting data, which can be stored, loaded, deleted and changed by controller 350.

FIG. 4A is a diagram illustrating a data structure of frequency-specific gains, which is used to store the equalizer setting of the mobile communication device of the present invention.

As shown in FIG. 4A, the data structure of frequency-specific gains includes frequency number 410, first frequency 411, first gain 412, second frequency 413, second gain 414, and so forth. The frequency number 410 indicates the number of frequencies to which gain values are to be set. The first frequency 411 indicates a first frequency value, and the first gain 412 indicates the gain of the first frequency. The second frequency 413 indicates a second frequency value, and the second gain 414 indicates the gain of the second frequency.

FIG. 4B is a diagram illustrating a data structure of country-specific equalizer setting, which is used to store the equalizer setting of a mobile communication device of the present invention.

As shown in FIG. 4B, the data structure of country-specific equalizer setting includes country number 430, name of first country 431, equalizer setting of first country 432, name of second country 433 and equalizer setting of second country 434. The country number 430 indicates the number of countries whose equalizer setting values are stored. The name of first country 431 indicates the name of a first country, and the equalizer setting of first country 432 indicates the equalizer setting of the first country, which has a data structure of frequency-specific gains as shown in FIG. 4A. The name of second country 433 indicates the name of a second country, and the equalizer setting of second country 434 indicates the equalizer setting of the second country.

FIG. 4C is a diagram illustrating a data structure of equalizer setting data, which is used to store the equalizer setting of a mobile communication device of the present invention.

As shown in FIG. 4C, the data structure of equalizer setting data includes currently-used equalizer setting 400, user-selected equalizer setting 420 and country-specific equalizer setting 440. The currently-used equalizer setting 400 has a data structure of frequency-specific gains as shown in FIG. 4A. The user-selected equalizer setting 420 indicates equalizer setting values, selected by the user, which have a data structure of frequency-specific gains as shown in FIG. 4A. The country-specific equalizer setting 440 indicates information related with country-specific equalizer setting, which has a data structure of country-specific equalizer setting as shown in FIG. 4B.

Hereinafter, the operation of the mobile communication device of the present invention will be described.

First, a process of setting frequency-specific gains of the equalizer 310 using the user interface 340 will be described.

Preferably, the user interface for setting the equalizer is provided as an item of a setting menu of the mobile communication device, particularly, a music and sound setting menu.

When the user selects the equalizer setting, the equalizer setting menu is displayed. The equalizer setting menu may include 'normal mode,' 'country-specific mode' and 'user mode'.

When the 'normal mode' is selected, the equalizer setting menu display part 341 enables the normal mode setting part 342.

The normal mode setting part 342 sets the initial equalizer setting value, given at the time of manufacturing in the equalizer 310 and stores the initial equalizer setting value in the currently-used equalizer setting 400 of the equalizer setting data of the internal memory 370.

When the country-specific mode is selected, the equalizer setting menu display part 341 enables the country-specific mode setting part 343.

The country-specific mode setting part 343 reads the country-specific equalizer setting from the internal memory 370 by the controller 350 and displays the country names 431 and 433, so that the user can select one of the displayed country names.

When the user selects one of the country names, the country-specific mode setting part 343 applies the equalizer setting 432 or 434 of the selected country to the equalizer 310 by the controller 350, and stores this value in the currently-used equalizer setting 400 of the equalizer setting data stored in the internal memory 370.

The country-specific module 343 supports adding a new country, deleting stored information of a country, editing a stored country name, and editing gains according to frequencies.

Preferably, the country-specific module 343 updates the country-specific equalizer setting 440 of the equalizer setting data, stored in the internal memory 370 the country-specific mode setting part 343 applies the equalizer setting 432 or 434 of the selected country to the equalizer 310 by the controller 350.

The country-specific mode setting part 343 provides an option of roaming service area synchronization, and when the option is selected, can apply the equalizer setting of a corresponding automatic roaming service area to the equalizer 310.

When the option of roaming service area synchronization is selected, the country-specific mode setting part 343 can read in a roaming service area-indicating value stored by a different module in charge of automatic roaming service and apply the equalizer setting of the corresponding country to the equalizer 310 by the controller 350.

In the case of automatic roaming service area change, the country-specific mode setting part 343 can apply the equalizer setting of the corresponding roaming service area to the equalizer 310.

Frequency-specific gains of the automatic roaming service country may be previously stored at the time of manufacturing or be changed by the user.

It is preferable that the frequency-specific gains of the 'automatic roaming service country' are previously stored in a mobile communication device when the device is manufactured.

The equalizer setting menu display part 341 enables the user mode setting part when the user mode is selected.

The user mode setting part 344 provides an interface for adjusting the gain of each frequency (see FIG. 2). Preferably, the initial value of each frequency-specific gain can be the user-selected equalizer setting 420 of the equalizer setting data stored in the internal memory 370.

When the user inputs a frequency-specific gain, the user module 344 applies the gain to the equalizer 310, and stores the gain in the currently-used equalizer setting 400 and the user-selected equalizer setting 420 of the equalizer setting data of the internal memory 370.

Next, a process of setting a frequency-specific gain in the equalizer 310 using the data link 360 will be described.

The data link 360 is connected to an external device, and when the equalizer setting data having a data structure, as shown in FIG. 4C, is received from the external device, the data link 360 notifies the arrival of the equalizer setting data to the controller 350.

When the data link 360 notifies the arrival of the equalizer setting data, the controller 350 stores the equalizer setting data, received from the external device, and applies the currently-used equalizer setting 400 of the received data to the equalizer 310.

Although the present disclosure has been described with an exemplary embodiment, various changes and modifications may be suggested to one skilled in the art. It is intended that the present disclosure encompass such changes and modifications as fall within the scope of the appended claims.

What is claimed is:
1. A mobile communication device comprising:
a user interface configured to receive a selection from a user of a mode for equalization, wherein the mode comprises one of a user mode, a country-specific mode, and a normal mode, and when the selected mode is the country-specific mode, to receive a selection from the user of a country;
an equalizer configured to adjust a tone color of a received sound; and
a controller configured, when the selected mode is the country-specific mode, to apply to the equalizer an equalizer setting corresponding to the selected country and to allow different types of equalizer settings to be used based on at least one of:

a roaming service area of the mobile communication device, and the selected country.

2. The mobile communication device according to claim 1, further comprising an internal memory configured to store equalizer setting data.

3. The mobile communication device according to claim 2, wherein the user interface includes:

a user mode setting part configured, when the selected mode is the user mode, to allow manual adjustment of the equalizer setting that is applied to the equalizer; and a country-specific mode setting part configured, when the selected mode is the country-specific mode, to allow the different types of equalizer settings to be used based on a current location of the mobile communication device when an automatic roaming service is selected by the user.

4. The mobile communication device according to claim 3, wherein the equalizer setting data comprises a first data structure, which includes a currently-used equalizer setting, a user-selected equalizer setting, and a country-specific equalizer setting.

5. The mobile communication device according to claim 4, wherein each of the currently-used equalizer setting and the user-selected equalizer setting comprises a second data structure, which includes a frequency number, a plurality of frequencies corresponding to the frequency number and gains of the frequencies.

6. The mobile communication device according to claim 5, wherein the country-specific equalizer setting comprises a third data structure, which includes a country number, a plurality of country names corresponding to the country number and an equalizer setting for each country name.

7. The mobile communication device according to claim 4, wherein the country-specific mode setting part is further configured to display country-specific equalizer setting information stored in the internal memory.

8. The mobile communication device according to claim 4, wherein the country-specific mode setting part is further configured to update country-specific equalizer setting information stored in the internal memory when a new country is added, country information is deleted from the memory, a country name is edited, or an equalizer setting for a particular country is edited.

9. The mobile communication device according to claim 4, further comprising:

a data link connected to an external device, wherein the controller is further configured to store in the internal memory an equalizer setting data inputted from the external device through the data link and apply the currently-used equalizer setting included in the inputted equalizer setting data to the equalizer.

10. The mobile communication device according to claim 1, wherein the user interface is further configured to provide an option of roaming service synchronization, and when the option of roaming service synchronization is selected, the controller is further configured to apply an equalizer setting optimized for a roaming service area to the equalizer.

11. The mobile communication device according to claim 10, wherein, when the roaming service synchronization option is selected, in response to a change in roaming service areas, the controller is further configured to automatically apply the equalizer setting, optimized for a new roaming service area, to the equalizer.

12. A method of setting a tone color of a received sound in a mobile communication device, comprising:

receiving, at an interface, a selection from a user of a mode for equalization, wherein the mode comprises one a user mode, a country-specific mode, and a normal mode;

receiving, at the interface, a selection from the user of a country when the selected mode is the country-specific mode;

applying, to an equalizer, an equalizer setting based on the selected mode, wherein when the selected mode is the country-specific mode, the equalizer setting corresponds to the selected country;

allowing different types of equalizer settings to be used based on at least one of:

a roaming service area of the mobile communication device, and the selected country; and adjusting, at the equalizer, the tone color of the received sound based on the equalizer setting.

13. The method according to claim 12, further comprising displaying an equalizer setting menu, wherein receiving a selection from a user of a mode comprises receiving a selection through the equalizer setting menu.

14. The method according to claim 12, further comprising:

providing an option of roaming service synchronization; and when the option is selected, enabling the equalizer setting to be optimized for a selected roaming service area.

15. A method of setting a tone color of a received sound in a mobile communication device, comprising:

connecting the mobile communication device to an external device;

receiving an equalizer setting from the external device;

allowing, different types of equalizer settings to be used based on at least one of:

a roaming service area of the mobile communication device, and the selected country; and adjusting, at an equalizer of the mobile communication device, the tone color of the received sound based on the received equalizer setting.

16. The method of claim 15, further comprising notifying a controller when the received equalizer setting is received from the external device.

17. The method of claim 16, further comprising transmitting equalizer setting data from the controller to the external device.

18. The method of claim 15, wherein the received equalizer setting comprises a first data structure, which includes a currently-used equalizer setting, a user-selected equalizer setting, and a country-specific equalizer setting.

19. The method of claim 18, wherein the country-specific equalizer setting comprises a second data structure, which includes a country number, a plurality of country names corresponding to the country number and an equalizer setting for each country name.

20. The method of claim 16, further comprising storing, by the controller, the received equalizer setting in a memory.

* * * * *